(12) United States Patent
Das et al.

(10) Patent No.: US 10,002,840 B1
(45) Date of Patent: Jun. 19, 2018

(54) SEMICONDUCTOR DEVICES HAVING DISCRETELY LOCATED PASSIVATION MATERIAL, AND ASSOCIATED SYSTEMS AND METHODS

(71) Applicant: Micron Technology, Inc., Boise, ID (US)

(72) Inventors: Mayukhee Das, Pittsburgh, PA (US); Jonathan S. Hacker, Meridian, ID (US); Christopher J. Gambee, Caldwell, ID (US); Chandra S. Tiwari, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days. days.

(21) Appl. No.: 15/672,006

(22) Filed: Aug. 8, 2017

(51) Int. Cl.
*H01L 23/00* (2006.01)
*H01L 21/66* (2006.01)
*H01L 25/065* (2006.01)

(52) U.S. Cl.
CPC ............ *H01L 24/05* (2013.01); *H01L 22/32* (2013.01); *H01L 24/11* (2013.01); *H01L 24/13* (2013.01); *H01L 25/0657* (2013.01); *H01L 2224/05624* (2013.01); *H01L 2224/13026* (2013.01); *H01L 2225/0652* (2013.01); *H01L 2924/01022* (2013.01); *H01L 2924/01029* (2013.01)

(58) Field of Classification Search
CPC ......... H01L 24/05; H01L 22/32; H01L 24/11; H01L 24/13; H01L 25/0657; H01L 2224/05624; H01L 2224/13026; H01L 2225/0652; H01L 2924/01022; H01L 2924/01029
See application file for complete search history.

(56) References Cited

U.S. PATENT DOCUMENTS

2004/0080049 A1* 4/2004 Kim .................. H01L 24/11
257/750

* cited by examiner

*Primary Examiner* — Karen Kusumakar
(74) *Attorney, Agent, or Firm* — Perkins Coie LLP

(57) ABSTRACT

Semiconductor devices having discretely located passivation material are disclosed herein. In one embodiment, a semiconductor device assembly can include a bond pad having a bonding surface with a process artifact. A passivation material can be positioned to at least partially fill a portion of the process artifact. A conductive structure can be positioned to extend across the bonding surface of the bond pad, and a conductive interconnect can extend from the conductive structure.

27 Claims, 10 Drawing Sheets

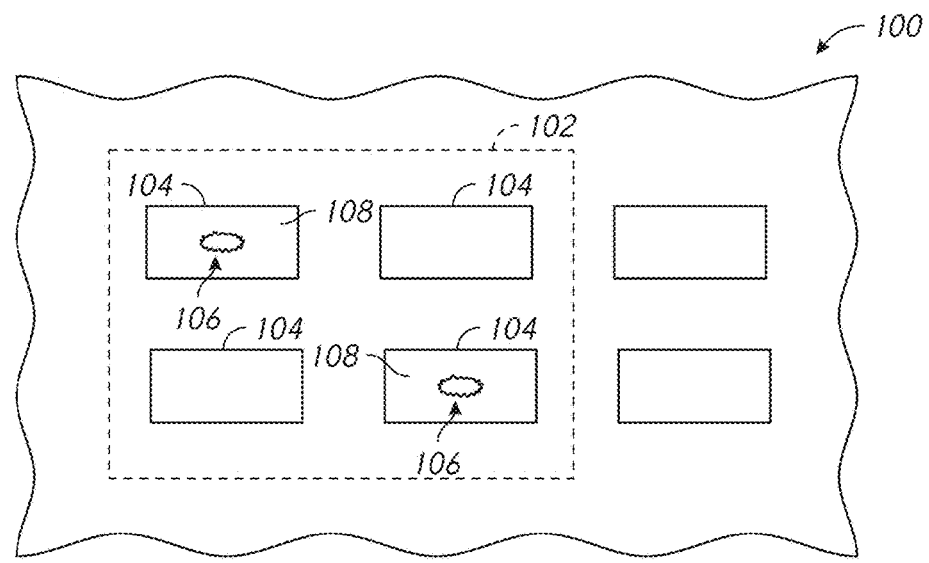
FIG. 1A
(Prior Art)
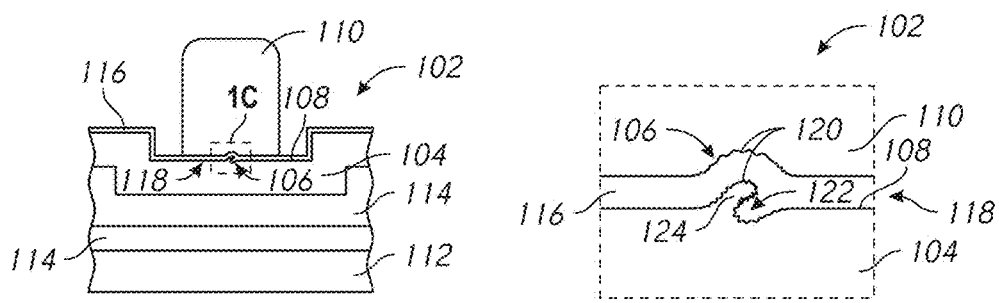
FIG. 1B
(Prior Art)
FIG. 1C
(Prior Art)

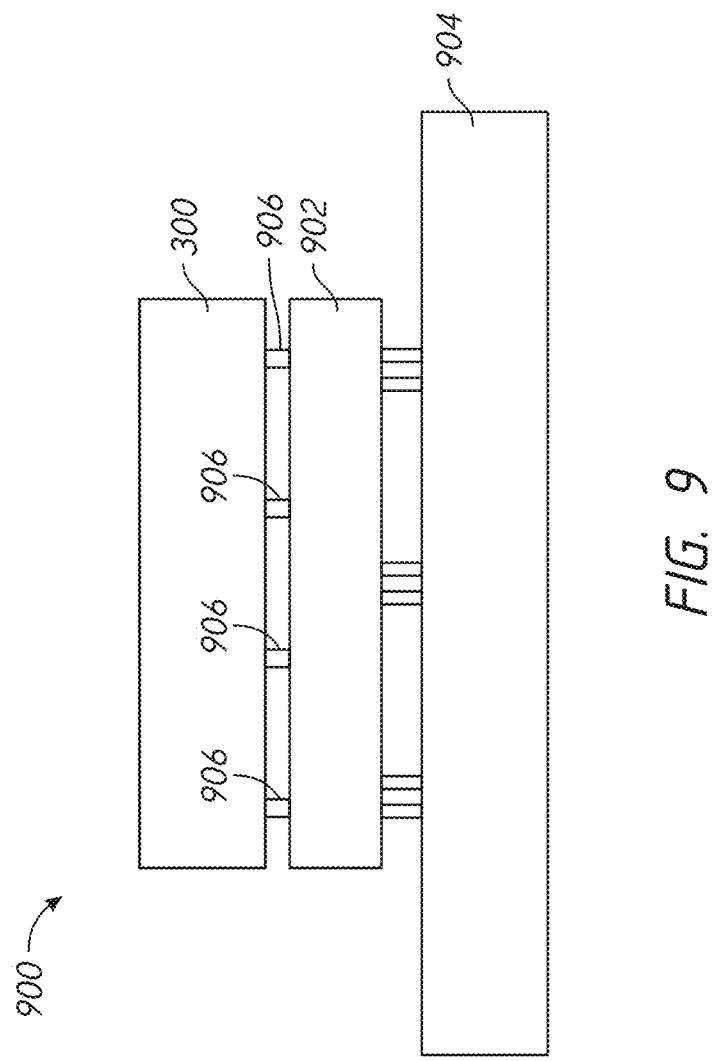

SEMICONDUCTOR DEVICES HAVING DISCRETELY LOCATED PASSIVATION MATERIAL, AND ASSOCIATED SYSTEMS AND METHODS

TECHNICAL FIELD

The disclosed embodiments relate to semiconductor devices, and in particular to semiconductor devices having discretely located passivation material.

BACKGROUND

Packaged semiconductor dies, including memory chips, microprocessor chips, and imaging chips, typically include one or more semiconductor dies mounted on a substrate and at least partially encased in a protective covering. The dies include functional features, such as memory cells, processor circuits, and imaging devices, as well as bond pads electrically connected to the functional features. The bond pads can, in turn, be electrically connected to terminals outside the protective covering to allow the die to be connected to higher level circuitry. Additionally, in devices having multiple dies (e.g., vertically stacked dies), interconnects or pillars can electrically connect adjacent dies via corresponding bond pads.

To provide a reliable and robust electrical connection, conductive materials that are connected to the bond pads need to be securely and uniformly bonded thereto. However, the fabrication of packaged semiconductors typically includes one or more processes that expose the bond pads and/or the conductive materials to corrosive chemicals that can corrode, degrade, or otherwise interfere with the bond between the bond pad pads and the conductive materials. A variety of techniques are used to minimize the adverse effects of the corrosive chemicals, but existing fabrication processes present opportunities for corrosion at the bond pads that can lead to degradation or failure of the electrical connections.

BRIEF DESCRIPTION OF THE DRAWINGS

FIG. 1A is a partially schematic, overhead view of a portion of a prior art semiconductor device.

FIG. 1B is a partially schematic, cross-sectional view of a portion of the prior art semiconductor device of FIG. 1A after the addition of a pillar.

FIG. 1C is a partially schematic, cross-sectional view of the prior art semiconductor device of FIGS. 1A and 1B illustrating a magnified view of a bond.

FIG. 9 is a partially schematic, cross-sectional view of a portion of a semiconductor device assembly configured in accordance with an embodiment of the present technology.

DETAILED DESCRIPTION

Figure 2A:
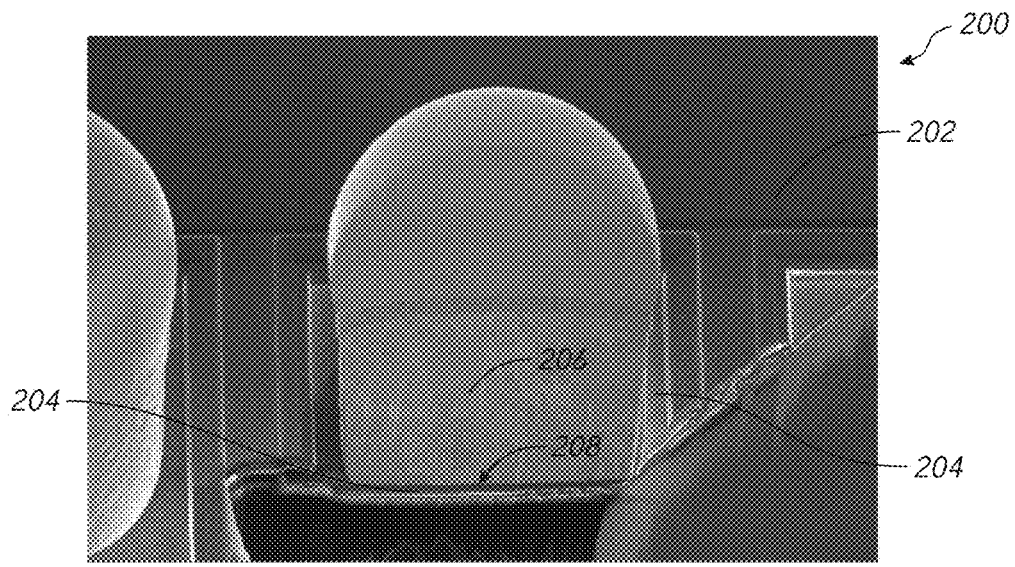
FIGS. 2A and 2B are partially cross-sectional, and cross-sectional focused ion beam scanning electron microscope (FIB-SEM) images, respectively, of a prior art wafer.

Specific details of several embodiments of semiconductor devices having discretely located passivation material are described below. The term "semiconductor device" generally refers to a solid-state device that includes semiconductor material. A semiconductor device can include, for example, a semiconductor substrate, wafer, or die that is singulated from a wafer or substrate. Throughout the disclosure, semiconductor devices are generally described in the context of semiconductor dies; however, semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing. The term "semiconductor device assembly" can refer to an assembly of one or more semiconductor devices, semiconductor device packages, and/or substrates (e.g., interposer, support, or other suitable substrates).

As used herein, the terms "vertical," "lateral," "upper," and "lower" can refer to relative directions or positions of features in the semiconductor device in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, overlying/underlying, above/below, up/down, and left/right can be interchanged depending on the orientation.

In the following description, numerous specific details are discussed to provide a thorough and enabling description for embodiments of the technology. One skilled in the relevant art, however, will recognize that the disclosure can be practiced without one or more of the specific details. In other instances, well-known structures or operations often associated with semiconductor devices are not shown, or are not described in detail, to avoid obscuring aspects of the technology. For example, several functional components of semiconductor dies, device assemblies, devices and packages that are known in the art are not discussed in detail below (e.g., doped semiconductor materials and active regions).

FIG. 1A is a partially schematic, overhead view of a portion of a prior art semiconductor device 100. In particular, the semiconductor device 100 is a wafer having a die 102. The die 102 includes a plurality of exposed bond pads 104 that are electrically connected to functional features of the die 102. The wafer 100 is shown in an intermediate stage of manufacture, before interconnects are added to the bond pads 104, but subsequent to testing of the die 102. More particularly, the die 102 includes process artifacts 106 on surfaces 108 of the bond pads 104. Specifically, the process artifacts 106 are probe scrub marks formed in the bond pad surface 108 during testing of the die 102. To test the die 102, probe tips are brought into contact with the surfaces 108 of corresponding bond pads 104 to form electrical connections between the bond pads 104 and the probe tips. Before testing, however, the surfaces 108 may oxidize and have an oxidation layer that can prevent electrical contact between the probe tips and the surfaces 108. To ensure a proper connection, the probe tips must penetrate any oxidation layer and maintain positive contact with the bond pads 104.

Various designs and methods can ensure a proper electrical connection between the probe tips and the bond pads 104. In general, these designs and methods produce a disruption of any oxidation layer, as well as a disruption of the surfaces 108, resulting in the scrub marks 106. In many cases, the probe tips contact the surfaces 108 at an angle, or otherwise include a horizontal component of motion that is parallel to the surfaces 108. Such movement produces a brow of material that is pushed upward in front of the probe tips, as well as furrows that are generated along the sides of the probe tips. Additionally, the motion of the probe tips can create voids, crevices, or other irregular features or process artifacts in the surfaces 108.

FIG. 1B is a partially schematic, cross-sectional view of a portion of the prior art die 102 after the addition of an interconnect or pillar 110. The die 102 can include a substrate 112 (e.g., silicon) and a plurality of materials 114 positioned between the substrate 112 and the bond pad 104. Subsequent to the testing that was described above, the die 102 undergoes several additional processing steps prior to the addition of the pillar 110. First, etching or other removal techniques are used to remove any oxidation on the surface 108. Subsequently, a bonding and/or seeding material 116 is added to the die 102 via physical vapor deposition or other techniques known in the art. The pillar 110 is subsequently formed via, e.g., plating above the bond pad 104 and on the seeding material 116. The pillar 110 is thereby bonded to the bond pad 104 via a bond 118 that includes the bonding and/or seeding material 116.

Subsequent and/or prior to the formation of the pillar 110, the wafer 100 and die 102 can be subjected to process chemicals that are corrosive to the bond pad 104. Although the bonding and/or seeding material 116 can act as a barrier to inhibit exposing the bond pad 104 to the corrosive chemicals, the coverage of the material 116 may not be continuous. For example, the material 116 may only provide step coverage due to underlying irregularities (e.g., the scrub mark 106). Additionally, the material 116 may have cracks, crevices, voids, or other discontinuities that allow corrosive process chemicals to contact the bond pad 104. In general, these corrosive chemicals are removed during follow on processes, and they are only in contact with the bond pad 104 for a limited time. Accordingly, for most portions of the surface 108, the chemicals generally do not present significant corrosion concerns. At the scrub mark 106, however, the process chemicals can be retained within voids or other irregularities in the surface 108, and produce relatively significant corrosion.

FIG. 1C is a partially schematic, cross-sectional view of the prior art die 102 illustrating a magnified view of a portion of the bond 118. As shown, the bond 118 includes significant corrosion 120 of the bond pad 104 and of the bonding and/or seeding material 116 at the scrub mark 106. Specifically, the illustrated portion of the bond 118 shows the corrosion 120 formed via action of corrosive process chemicals that become "trapped" or otherwise contained within a void 122 located under a brow 124.

Figure 2B:
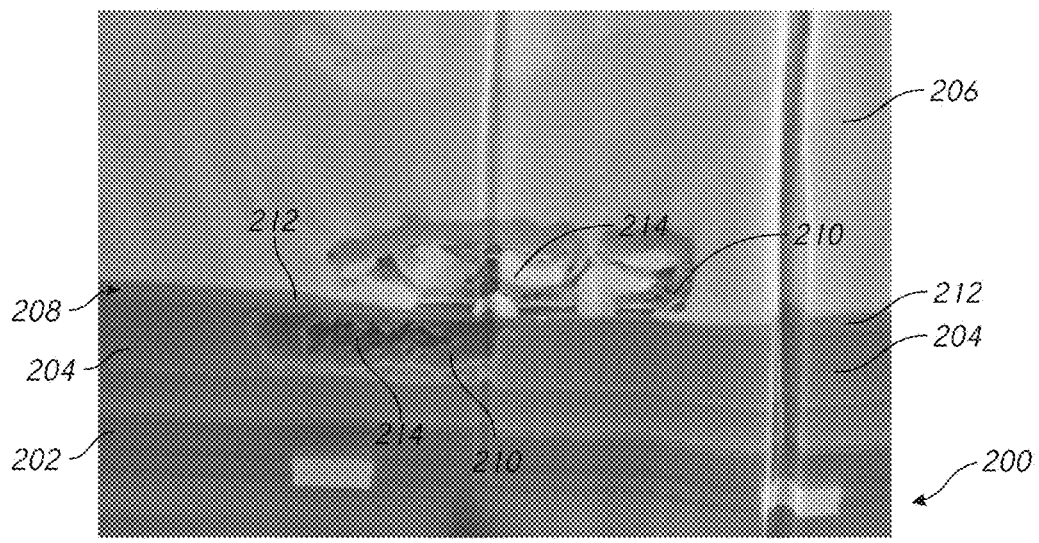

FIGS. 2A and 2B are partially cross-sectional, and cross-sectional focused ion beam scanning electron microscope (FIB-SEM) images, respectively, of a prior art wafer 200 illustrating several of the features discussed above with respect to FIGS. 1A to 1C. FIG. 2A, for example, is an SEM at 1200× magnification, showing the wafer 200, a die 202, a bond pad 204, a pillar 206, and a bond 208 between the pillar 206 and the bond pad 204. FIG. 2B is an SEM at 15000× magnification showing the bond 208 and corrosion 210 in the bond pad 204 and in a bonding material 212. As shown in FIG. 2B, corrosive process chemicals have corroded significant portions of the bond pad 204 and the bonding material 212, creating voids 214 through portions of the bond pad 204, the bonding material 212, and the pillar 206. The voids 214 and the corrosion 210 can increase the resistance of the electrical connection between the pillar 206 and the bond pad 204, producing increased heat and decreased performance of an associated finished device. Moreover, the corrosion can result in failure of the bond 208 and the finished device.

Figure 3A:
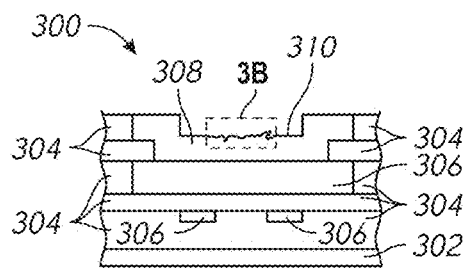
FIG. 3A is a partially schematic, cross-sectional view of a die configured in accordance with an embodiment of the present technology.

FIGS. 3A to 9 illustrate the formation of a semiconductor device assembly configured in accordance with an embodiment of the present technology. First, FIG. 3A is a partially schematic, cross-sectional view of a die 300 configured in accordance with an embodiment of the present technology. The die 300 may be one of a plurality of identical dies that are simultaneously fabricated on an associated wafer to include the same features. In the illustrated embodiment, the die 300 includes a substrate 302, dielectric materials 304, conductive features 306 (e.g., traces, redistribution structures, contact pads, etc.), and a bonding element or bond pad 308 having a surface 310. The cross-sectional view of FIG. 3A illustrates a cross-sectional view of a portion of the die 300 at a particular location (i.e., at the bond pad 308). It is to be understood that other portions of the die 300 can include additional materials, structures, devices and components. For example, the die 300 can include doped semiconductor materials, active regions, and/or a variety of other materials and structures known in the art.

Figure 3B:
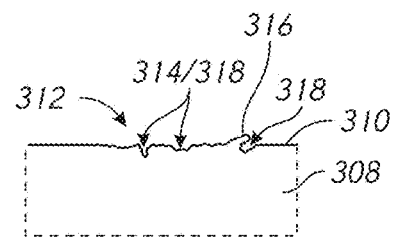
FIG. 3B is a partially schematic, enlarged, cross-sectional view of a portion of a bond pad and a bond pad surface.

FIG. 3B is a partially schematic, enlarged, cross-sectional view of a portion of the bond pad 308 and the bond pad surface 310 of FIG. 3B. The surface 310 includes a scrub mark 312 having crevices or depressions 314 and a brow or furrow 316. As used herein, the term brow or furrow can refer to any portion of a surface forming an overhanging feature. The crevices 314 and the brow or furrow 316 define openings, recesses or voids 318 in the bond pad 308. In several embodiments, the scrub mark 312 can extend across a minority of the bonding surface 310 (i.e., the scrub mark can occupy an area that is less than half of the total area of the bonding surface 310).

Figure 4A:
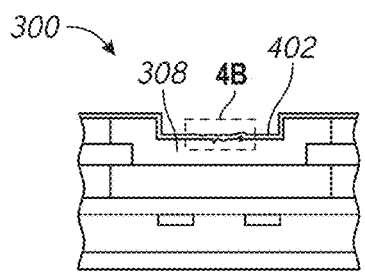
FIGS. 4A to 7B are partially schematic, cross-sectional and isometric views illustrating a method of manufacturing a die having passivation material and a pillar, and configured in accordance with an embodiment of the present technology.
Figure 4B:
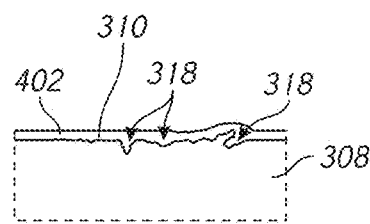

FIG. 4A is a partially schematic, cross-sectional view of the die 300 and a passivation material 402 configured in accordance with an embodiment of the present technology. As described in more detail below, the passivation material 402 can be an oxidation material that is formed via immersion of the die 300 and an associated wafer in a chemical solution. FIG. 4B is a partially schematic, enlarged cross-sectional view of a portion of the bond pad 308 and the passivation material 402. As shown in FIG. 4B, the passivation material 402 covers the surface 310 of the bond pad 308 and fills the voids 318.

Figure 5A:
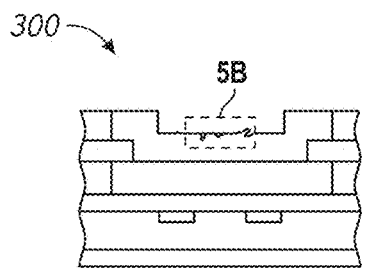
Figure 5B:
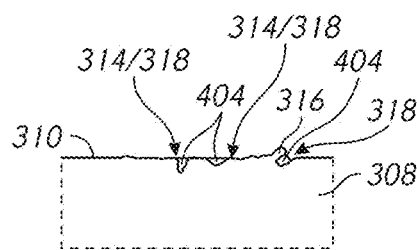

FIG. 5A is a partially schematic, cross-sectional view of the die 300 after portions of the passivation material 402 have been removed in accordance with an embodiment of the present technology. FIG. 5B is a partially schematic, enlarged cross-sectional view of a portion of the bond pad 308 after the portions of the passivation material 402 have been removed. The portions of the passivation material 402 can be removed via various semiconductor fabrication techniques, including etching and/or other suitable removal methods. For example, the portions of the passivation material 402 can be removed via plasma etching with, e.g., argon. After the removal of the portions of the passivation material 402, several other portions of the passivation material 402 remain. In particular, portions of the passivation material 402 remain in the voids 318 defined by the crevices 314 and the brow 316. These features in effect at least partially "protect" portions of the passivation material 402 within the voids 318 such that the removal process does not remove all of the passivation material 402. The voids 318 each contain a corresponding discrete portion 404 of the passivation material 402 that can at least partially fill their corresponding voids 318. For example, as shown in FIG. 5B, one of the discrete portions 404 at least partially underfills the brow 316. In several embodiments, removal of the portions of the passivation material 402 removes all of the passivation material outside of the portion of the surface 310 that includes the scrub mark 312.

Figure 6A:
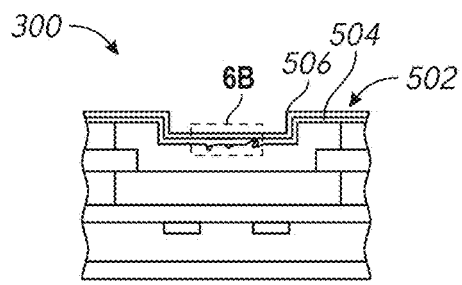

FIG. 6A is a partially schematic, cross-sectional view of a portion of the die 300 after the addition of a conductive structure 502 in accordance with an embodiment of the present technology. In the illustrated embodiment, the conductive structure 502 includes an adhesive material 504 and a seed material 506 that can be added to the die 300 via physical vapor deposition (PVD). In some embodiments, the adhesive material 504 is titanium and the seed material 506 is copper. In other embodiments, the conductive structure 502 can include more or fewer materials, including materials other than titanium or copper (e.g., titanium nitride, titanium tungsten, tantalum, etc.). The adhesive material 504 can be added to the die 300 directly adjacent to the bond pad 308, encasing the scrub mark 312 and forming a secure bond to the bond pad 308. The seed material 506 can be formed on, and bonded to, the adhesive material 504. In the illustrated embodiment, the adhesive material 504 and the seed material 506, together, form the conductive structure 502, which is securely bonded to the bond pad 308.

Figure 6B:
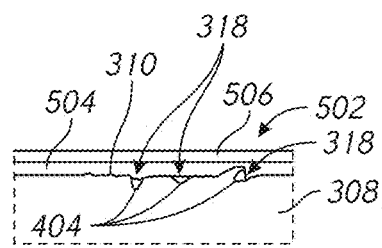

FIG. 6B is a partially schematic, enlarged cross-sectional view of a portion of the bond pad 308 after the addition of the conductive structure 502. As shown in FIG. 6B, the adhesive material 504 is in direct contact with the surface 310 across a majority of the bond pad 308. Specifically, the only portions of the surface 310 that are not in contact with the adhesive material 504 are those portions of the surface 310 at the location of the voids 318 (which are occupied by the discrete portions 404 of the passivation material 402). Although the portions 404 of the passivation material 402 can be dielectric and can potentially increase the resistance between the conductive structure 502 and the bond pad 308, the total amount of contact between the portions 404 of the passivation material 402 and the adhesive material 504 constitutes a relatively minor amount in comparison to the amount of contact between the surface 310 and the adhesive material 504 (e.g., less than one percent). Accordingly, the conductive adhesive material 504 forms a strong electrical connection with the bond pad 308.

Figure 7A:
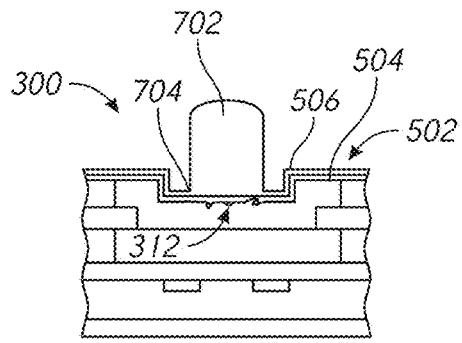
Figure 7B:
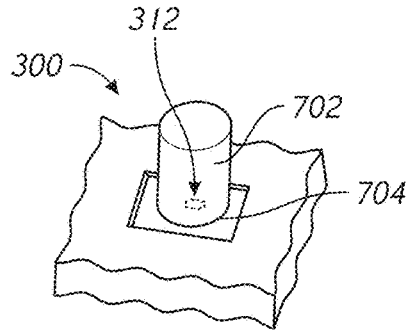

FIGS. 7A and 7B are partially schematic, isometric and cross-sectional views, respectively, of the die 300 after the addition of a conductive interconnect or pillar 702 configured in accordance with an embodiment of the present technology. The pillar 702 can be added to the die 300 via one or more semiconductor fabrication techniques (e.g., plating and reflow). In the illustrated embodiment, the pillar 702 is attached to the bond pad 308 via the conductive structure 502. Specifically, the pillar 702 extends from the seed material 506 at a location that is above and overlies the scrub mark 312. More particularly, the pillar 702 includes a base 704, and the pillar 702 is positioned such that a footprint of the pillar 702 overlies the scrub mark 312. That is, a projection of the base 704 onto the bond pad 308 defines an area having a perimeter that surrounds or encircles the scrub mark 312. In several embodiments, the pillar 702 and the seed material 506 can be copper, and a reflow process can join the pillar 702 and the seed material 506 into a continuous material (as illustrated in FIG. 7A).

Figure 8A:
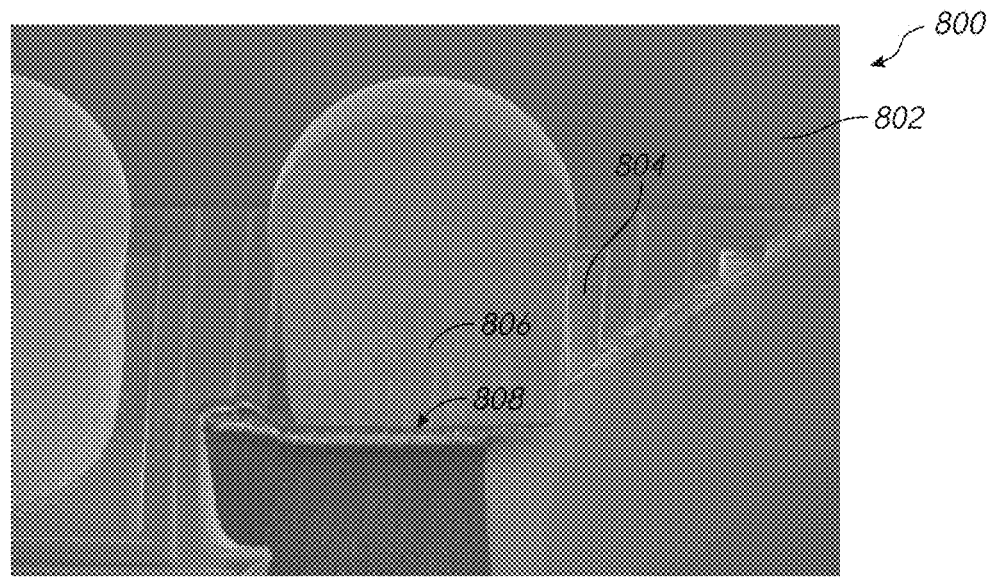
FIGS. 8A and 8B are partially cross-sectional, and cross-sectional FIB-SEM images, respectively, of a wafer configured in accordance with an embodiment of the present technology.
Figure 8B:
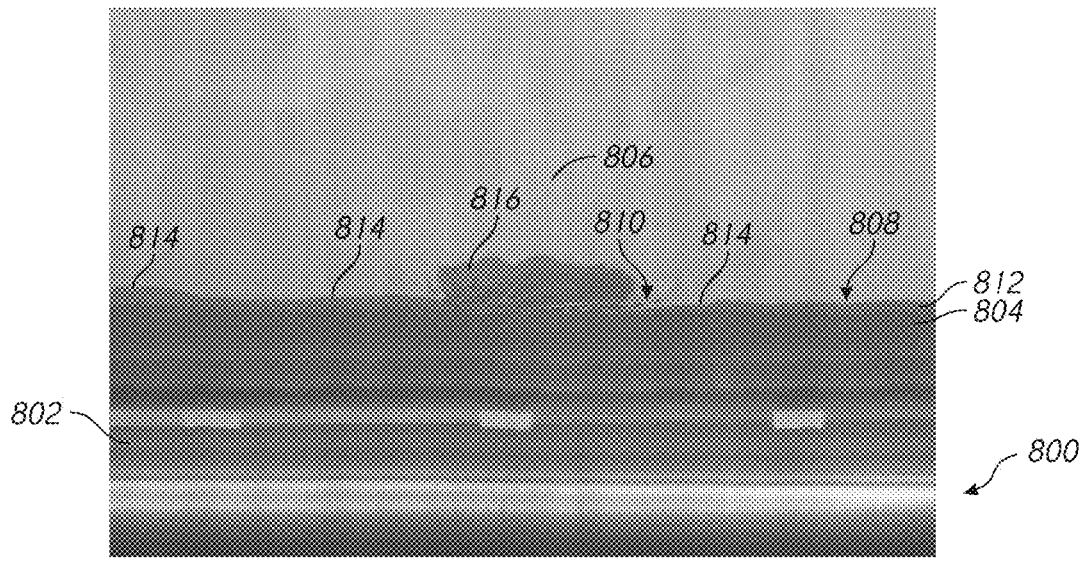

FIGS. 8A and 8B are partially cross-sectional, and cross-sectional FIB-SEM images, respectively, of a wafer 800 configured in accordance with an embodiment of the present technology and illustrating several of the features discussed above with respect to FIGS. 3A to 7B. FIG. 8A, for example, is an SEM at 1000× magnification, showing the wafer 800, a die 802, a bond pad 804, a pillar 806, and a bond 808 between the pillar 806 and the bond pad 804. FIG. 8B is an SEM at 15000× magnification showing the bond 808, a scrub mark 810, and an adhesive material 812. As shown, the scrub mark 810 includes several interruptions in a surface 814 of the bond pad 804. For example, the scrub mark 810 has caused a noncontiguous region 816 in the adhesive material. Notably, however, the bond 808 does not exhibit any corrosion, and the bond pad 804 has no voids. Rather, passivation material (not visible in FIGS. 8A and 8B) has filled any voids in the surface 814, and reduced or prevented the opportunity for corrosion to occur at the bond 808.

FIG. 9 is a partially schematic, cross-sectional view of a portion of a semiconductor device assembly 900 configured in accordance with an embodiment of the present technology. In the illustrated embodiment, the device assembly 900 includes the die 300 and a die 902 in a vertically stacked configuration. It is to be understood, however, that device assemblies configured in accordance with the present technology can include many more dies (e.g., 4, 8, or more dies in one or more stacks and/or in other configurations). The dies 300 and 902 are stacked on a controller 904 and are electrically connected to one another via a plurality of pillars 906. The die 902 can be substantially similar to the die 300 described above with reference to FIGS. 3-7, and the pillars 906 can be bonded to bond pads in the corresponding dies 300 and 902.

In several embodiments, the bond pads 308 and 804 discussed above with reference to FIGS. 3A to 8 can be aluminum bond pads. To produce the passivation material 402, a wafer having exposed aluminum bond pads can be immersed in a chemical solution that includes tetramethylammonium hydroxide (TMAH), silicon, and ammonium persulfate. In particular, the inventors have discovered that solutions having various ratios of these chemicals can create the passivation material 402 via chemical reactions between these chemicals and the aluminum in the bond pads 308 and 804. Several of the chemical reactions associated with formation of the passivation material 402 follow:

A. Formation of silicon oxide via TMAH and silicon:
1. $C_4H_{13}NO \rightarrow C_4H_{12}N^+ + OH^-$
2. $Si + 2OH^- + 2H_2O \rightarrow SiO_2(OH)_2^{2-} + 2H_2$
3. $SiO_2(OH)_2^{2-} \rightarrow SiO_2 + 2OH^-$ B. Formation of aluminum oxide via ammonium persulfate and aluminum:
1. $(NH_4)_2S_2O_8 \rightarrow 2NH_4^+ + S_2O_8^{2-}$
2. $2Al + 3S_2O_8^{2-} + 3H_2O \rightarrow Al_2O_3 + 6SO_4^{2-} + 6H^+$ As can be seen in reactions A1 to A3, the TMAH produces a basic solution that can react with the silicon to produce silicon dioxide. The silicon dioxide can form a portion of the passivation material 402. Additionally, as shown in reactions B1 and B2, the ammonium persulfate can dissolve the aluminum bond pads to produce aluminum oxide. The aluminum oxide also forms a portion of the passivation material.

The inventors conducted extensive experiments that included the preparation and testing of a variety of solutions having differing chemical ratios. These experiments were designed to determine preferred chemical ratios to generate thicker formations of the passivation material 402. In one such experiment, the inventors compared two differing chemical solutions configured in accordance with embodiments of the present technology, referred to herein as composition 1 and composition 2. Compositions 1 and 2 included the following mass/volume chemical percentages:

| Chemical | Composition 1 Mass/Volume % | Composition 2 Mass/Volume % |
| --- | --- | --- |
| TMAH | 5 | 10 |
| Ammonium Persulfate | 2.5 | 1.5 |
| Silicon | 2 | 3 |

After preparing compositions 1 and 2 in accordance with the table above, the compositions were agitated and a first portion of each composition was subsequently heated to 60 degrees Celsius, and a second portion of each composition was heated to 70 degrees Celsius. Semiconductor wafers having die with exposed aluminum bond pads (e.g., the die 300 with the bond pads 308) were then submerged in the various solutions for either 5 minutes or 10 minutes to form a passivation material (e.g., passivation material 402) having aluminum oxide material and silicon oxide material. After removal from the solutions, the wafers were analyzed via X-ray photoelectron spectroscopy (XPS) to determine the thickness of the aluminum oxide ($AlO_x$) material and the thickness of the silicon oxide ($SiO_x$) material.

Figure 10A:
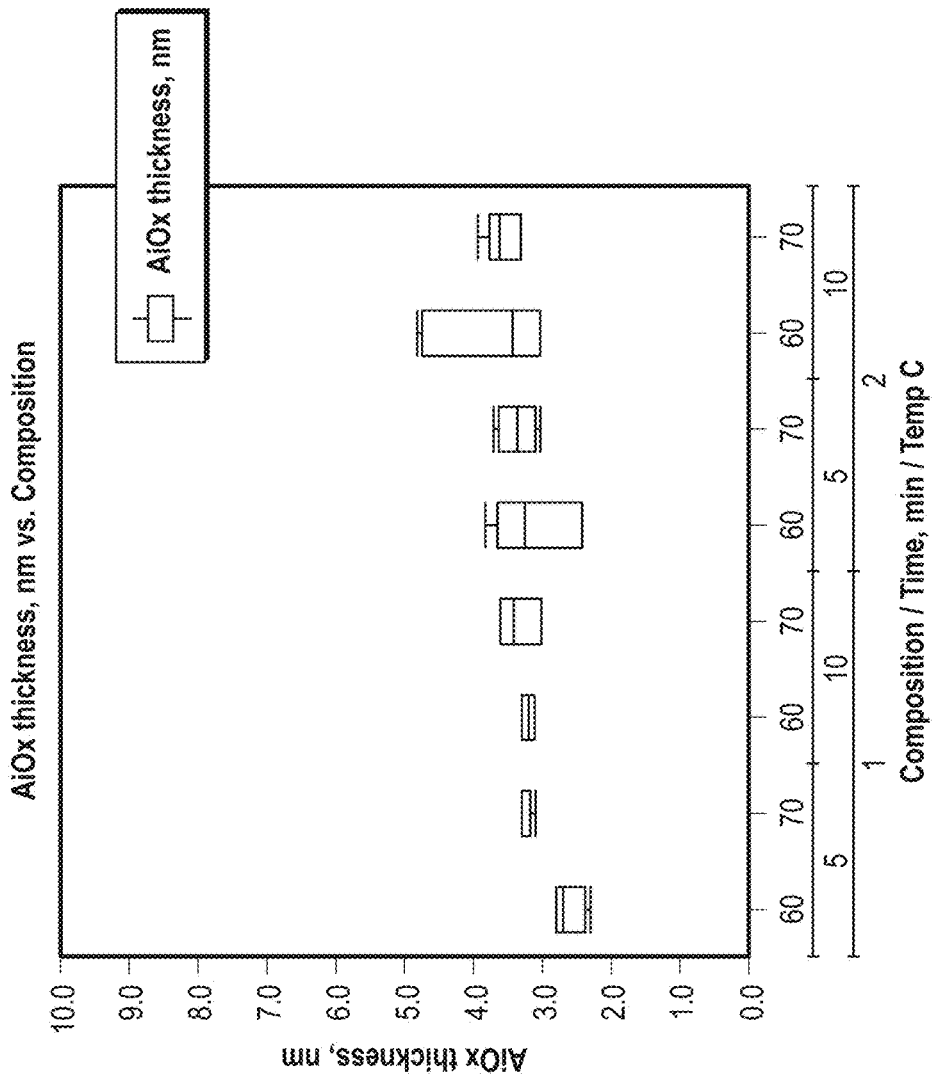
FIG. 10A is a graph illustrating a thickness of an aluminum oxide material formed on wafers treated with differing compositions configured in accordance with embodiments of the present technology.
Figure 10B:
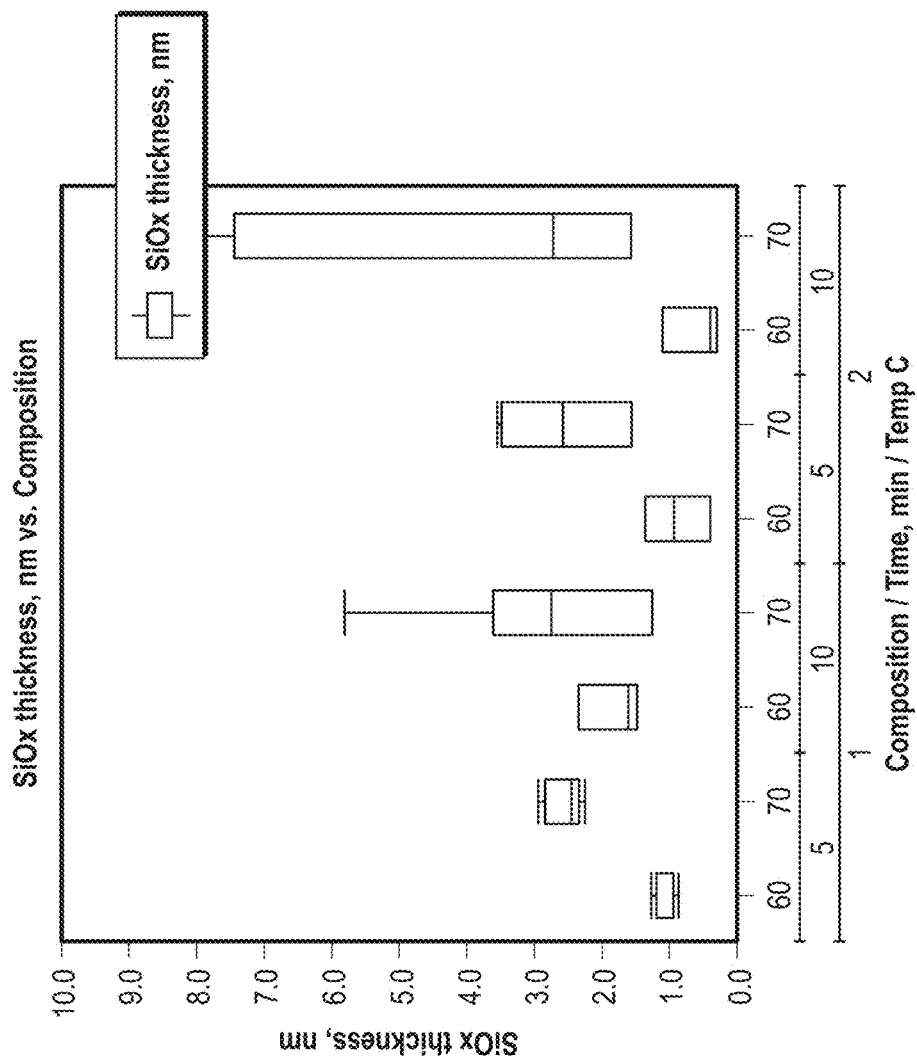
FIG. 10B is a graph illustrating a thickness of a silicon oxide material formed on wafers treated with differing compositions configured in accordance with embodiments of the present technology.

FIG. 10A is a graph illustrating a thickness of an aluminum oxide material formed on wafers treated with differing compositions, differing temperatures, and for differing durations. As can be seen in FIG. 10A, composition 2 provides a thicker coverage of aluminum oxide. FIG. 10B is a graph illustrating a thickness of a silicon oxide material formed on wafers treated with differing compositions, differing temperatures, and for differing durations. As shown in FIG. 10B, composition 2 also provides a thicker coverage of silicon oxide.

Figure 11:
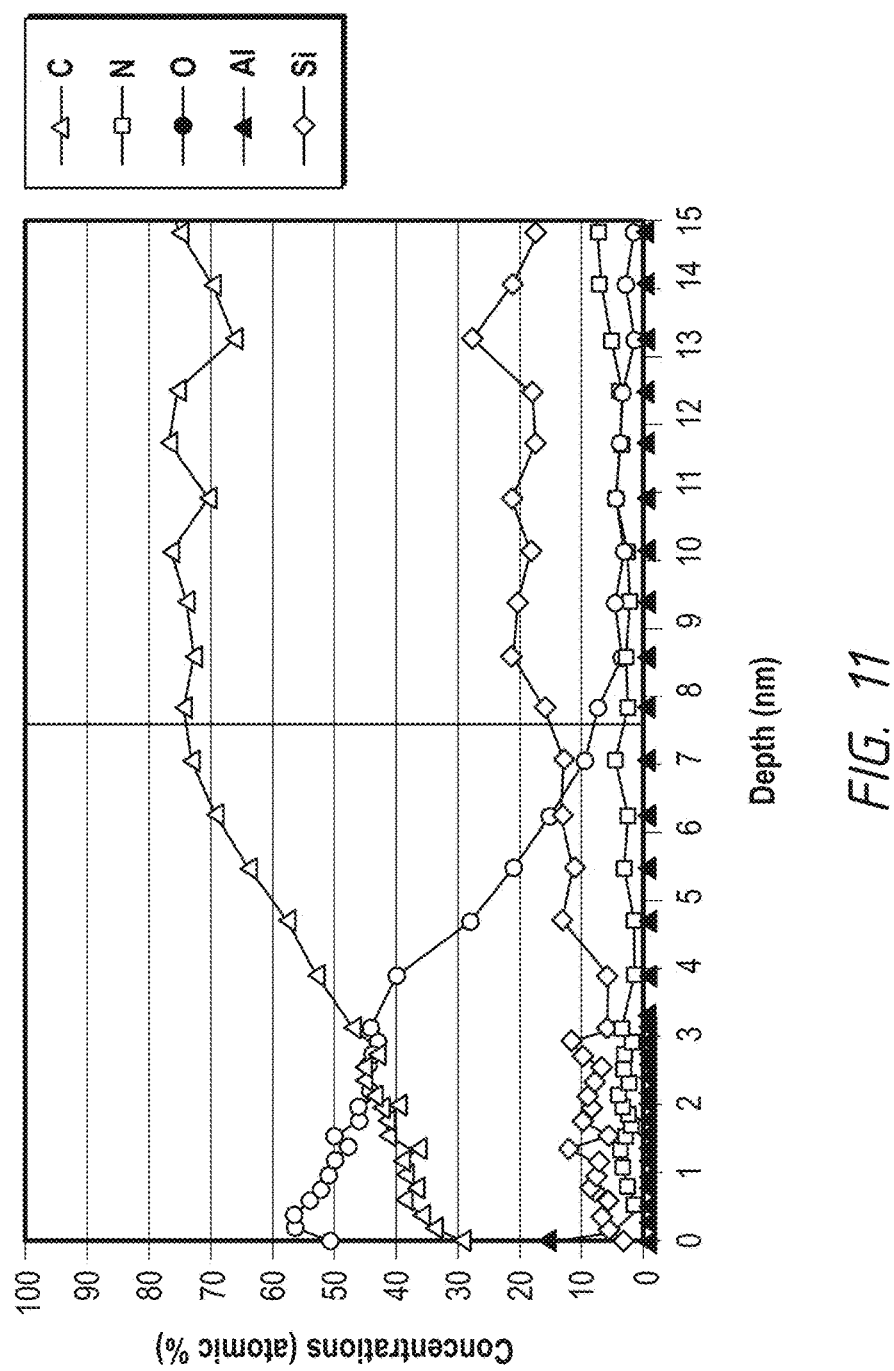
FIG. 11 is a graph illustrating atomic concentration percentages for various elements as a function of depth in a passivation material formed on wafers in accordance with embodiments of the present technology.

In addition to measurements of the thickness of aluminum oxide coverage and silicon oxide coverage for the tested wafers, XPS sputter depth profiling was performed to determine atomic concentrations. FIG. 11 is a graph illustrating atomic concentration percentages for various elements as a function of depth. Specifically, FIG. 11 illustrates atomic concentrations of elements in a passivation material formed on a wafer treated with composition 2 at 70 degrees Celcius for 8 minutes. As shown, the treatment produced a passivation material having continuous coverage of aluminum, silicon, and oxygen to a depth of approximately 10 nm (100 Å).

Figure 12:
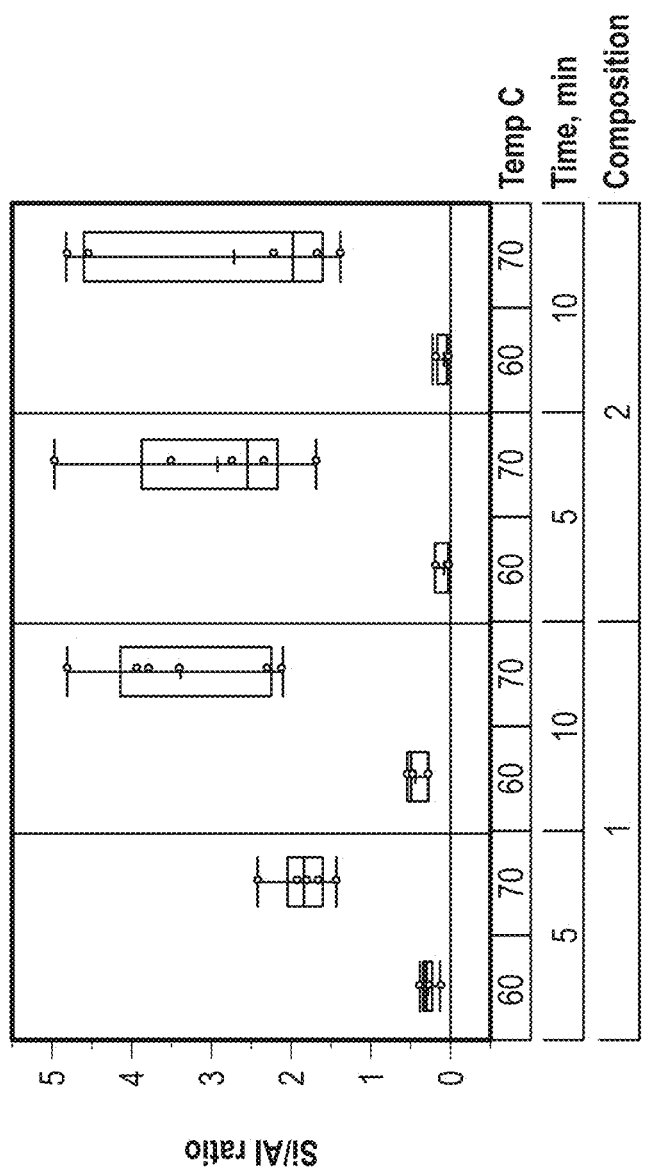
FIG. 12 is a graph illustrating ratios of silicon to aluminum within passivation materials formed on wafers in accordance with embodiments of the present technology.

FIG. 12 is a graph illustrating ratios of silicon to aluminum within passivation materials formed on wafers treated with differing compositions, differing temperatures, and for differing durations. The ratios shown in the graph of FIG. 12 were measured using time of flight secondary ion mass spectrometry (TOF-SIMS). As shown, the oxide passivation material that was analyzed includes silicon and aluminum, and composition 2 produced significantly higher ratios of silicon to aluminum than composition 1.

The formation of passivation materials configured in accordance with embodiments of the present technology can include providing sufficient silicon in a solution to reduce or prevent any significant etching of aluminum (e.g., the aluminum bond pads 308 and, 804). Specifically, absent an adequate concentration of silicon, solutions having TMAH can produce significant etching of exposed aluminum bond pads. In some embodiments, silicon is added to an 8% mass/volume solution of TMAH to produce a mass/volume silicon concentration of at least 3%. In such embodiments, the etching of the aluminum bond pads is significantly reduced.

In several embodiments, a temperature of a solution or composition is maintained at or below 80 degrees Celcius to ensure adequate dissolution of silicon. Specifically, above 80 degrees Celcius, TMAH can rapidly disassociate, preventing the dissolution of silicon. However, as the silicon concentration increases, the dissolution rate of silicon decreases. To continue dissolving silicon to reach the desired concentration (e.g., 3% mass/volume), the temperature can be maintained at or above 60 degrees Celcius.

The formation of aluminum oxides via the processes and methods described herein can include a concurrent decrease in the mass/volume percentage of TMAH in a corresponding composition. Specifically, the TMAH can disassociate as part of the chemical process that forms the aluminum oxides. In several embodiments, the TMAH that is consumed in the chemical reactions can be replaced to maintain a relatively constant mass/volume percentage. Specifically, TMAH can be added to a composition (while wafers are immersed therein) to maintain a mass/volume percentage of TMAH at a desired value (e.g., 8%).

Passivation materials formed in accordance with embodiments of the present technology can exhibit several desirable characteristics. For example, although naturally occurring passivation materials can provide some protection from corrosion, these materials are generally too thin (often less than 1 nm) and are stripped away during various fabrication steps (e.g., etching, process chemicals, etc.). Embodiments configured in accordance with the present technology can include passivation material having thicknesses of 3 to 4 nm, or thicker. The thicker passivation material ensures that at least some will remain, particularly at the jagged and irregular surface features associated with probe scrub marks or other process artifacts. The remaining passivation material can protect against corrosion in the manner discussed above, providing for lower resistance electrical connections and more secure and robust bonds between materials and components.

Additionally, passivation materials configured in accordance with the present technology can include both aluminum oxides and silicon oxides. In several embodiments, a ratio of aluminum to silicon in the passivation material can be approximately 3 to 1. In other embodiments, this ratio can be higher or lower than 3 to 1. The aluminum oxides and silicon oxides can be in separate layers within a passivation material or passivation structure, and/or they can be intermixed within one or more layers (e.g., aluminum oxides and silicon oxides intermixed within a layer that is positioned between a monolayer of aluminum oxides and a monolayer of silicon oxides). Regardless of the distribution of the aluminum oxides and silicon oxides, the inclusion of both of these materials in the embodiments disclosed herein can provide significant advantages over a natural passivation material having only aluminum oxide. Specifically, passivation material having both aluminum oxide and silicon oxide has been shown to be significantly less susceptible to corrosion from process chemicals (e.g., TMAH).

Although in the foregoing embodiments, the use of a passivation material to remediate probe scrub mark process artifacts has been described, the present technology has application to other process artifacts or irregular surface features. For example, any discontinuous barrier film (e.g., at the edge of a bond pad opening) can benefit from the mitigation of corrosion, damage, etc. of underlying films using a passivation material as set forth in greater detail in the examples above. Moreover, other surface features having non-planar or non-continuous shapes can similarly benefit (e.g., where barrier films are difficult to dispose due to step coverage limitations).

From the foregoing, it will be appreciated that specific embodiments of the technology have been described herein for purposes of illustration, but that various modifications may be made without deviating from the disclosure. For example, in addition to or in place of the conductive structure 502 and the pillar 702, other materials and components can be bonded to bond pads having discretely located passivation material. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A semiconductor device assembly, comprising:
    a semiconductor die including—
        a bond pad having a bonding surface, wherein the bonding surface includes a process artifact; and
        a passivation material at least partially filling a portion of the process artifact;
    a conductive structure extending across the bonding surface of the bond pad; and
    a conductive interconnect extending from the conductive structure.

2. The semiconductor device assembly of claim 1 wherein the conductive interconnect has a base that overlies the process artifact.

3. The semiconductor device assembly of claim 1 wherein the process artifact comprises a probe scrub mark forming an overhanging portion on the bonding surface of the bond pad, and wherein the passivation material at least partially underfills the overhanging portion.

4. The semiconductor device assembly of claim 1 wherein the process artifact comprises a probe scrub mark forming a crevice on the bonding surface of the bond pad, and wherein the passivation material at least partially fills the crevice.

5. The semiconductor device assembly of claim 1 wherein the passivation material is dielectric, and wherein the process artifact includes a brow forming a void.

6. The semiconductor device assembly of claim 1 wherein the passivation material is dielectric, and wherein the process artifact includes a furrow forming a void.

7. The semiconductor device assembly of claim 1 wherein the process artifact comprises a probe scrub mark extending across a portion of the bonding surface of the bond pad, and wherein the passivation material is dielectric and is contained within the portion of the surface of the bond pad.

8. The semiconductor device assembly of claim 1 wherein the conductive structure includes an adhesion material and a seed material, wherein the adhesion material extends across the bonding surface, wherein the seed material extends across the adhesion material, and wherein the conductive interconnect extends from the seed material.

9. The semiconductor device assembly of claim 1 wherein the bond pad is an aluminum bond pad, and wherein the passivation material includes silicon oxide ($Al_xSi_yO_z$).

10. The semiconductor device assembly of claim 1 wherein the bond pad is an aluminum bond pad, and wherein the passivation material includes aluminum silicon oxide ($Al_xSi_yO_z$), aluminum oxide ($Al_{x1}O_{y1}$), and silicon oxide ($Si_{x2}O_{y2}$).

11. The semiconductor device assembly of claim 1 wherein the die is a first die and the bond pad is a first bond pad, the semiconductor device assembly further comprising a second die having a second bond pad, and wherein the conductive interconnect provides an electrical connection between the first bond pad and the second bond pad.

12. A semiconductor device assembly, comprising:
    a die having a bonding element, a passivation material, and one or more conductive materials, wherein the bonding element includes a bonding surface having a probe scrub mark, wherein the probe scrub mark extends across a minority of the bonding surface, wherein the passivation material is contained within the minority of the bonding surface, and wherein the one or more conductive materials extend across the bonding surface; and
    a pillar extending from the one or more conductive materials, wherein the pillar includes a base defining a footprint.

13. The semiconductor device assembly of claim 12 wherein the footprint overlies the minority of the bonding surface.

14. The semiconductor device assembly of claim 12 wherein the bonding element is an aluminum bond pad, and the passivation material includes aluminum silicon oxide ($Al_xSi_yO_z$).

15. The semiconductor device assembly of claim 12 wherein the probe scrub mark defines a plurality of voids in the bonding surface, and wherein the passivation material is at least partially positioned within the voids.

16. The semiconductor device assembly of claim 12 wherein the die is a first die, wherein the semiconductor device assembly further includes a second die, and wherein the pillar provides an electrical connection between the first die and the second die.

17. The semiconductor device assembly of claim 12 wherein the probe scrub mark includes a brow forming a void, and wherein the passivation material at least partially fills the void.

18. The semiconductor device assembly of claim 12 wherein the probe scrub mark includes a furrow forming a void, and wherein the passivation material at least partially fills the void.

19. The semiconductor device assembly of claim 12 wherein the probe scrub mark includes a crevice in the bonding surface, and wherein the passivation material at least partially fills the crevice.

20. A method of forming a semiconductor device assembly, comprising
    forming a semiconductor die having a bond pad;
    contacting the bond pad with a probe, wherein contacting the bond pad with the probe includes forming a probe scrub mark on the bond pad;
    forming a passivation material on the bond pad, wherein the passivation material extends across the bond pad and at least partially fills the probe scrub mark;
    etching away portions of the passivation material that extend across the bond pad outside of the probe scrub mark; and
    forming a conductive structure that extends across the bond pad and covers the probe scrub mark.

21. The method of claim 20 wherein forming the passivation material includes applying a solution to the semiconductor die, wherein the solution includes tetramethyl ammonium hydroxide, silicon and ammonium persulfate.

22. The method of claim 21 wherein the mass/volume percentage of the tetramethyl ammonium hydroxide in the solution is 8 to 10 percent, the mass/volume percentage of the silicon in the solution is 1.5 to 3 percent, and the mass/volume percentage of the ammonium persulfate in the solution is 2 to 2.5 percent.

23. The method of claim 22 wherein applying the solution to the semiconductor die includes maintaining the solution at a temperature of 68 to 82 degrees Celcius, and immersing the die in the solution.

24. The method of claim 20 wherein forming the passivation material includes forming an aluminum silicon oxide ($Al_xSi_yO_z$).

25. The method of claim 20 wherein forming the passivation material includes growing an oxide on a surface of the bond pad.

26. The method of claim 20, further comprising forming a conductive interconnect on the conductive structure, wherein the conductive interconnect overlies the probe scrub mark.

27. The method of claim 26 wherein forming the conductive structure includes forming a titanium material that extends across the bond pad and forming a copper material that extends across the titanium material, and wherein forming the conductive interconnect includes forming the conductive interconnect on the copper material.

* * * * *